US010483253B1

(12) United States Patent
Hu

(10) Patent No.: US 10,483,253 B1
(45) Date of Patent: Nov. 19, 2019

(54) DISPLAY WITH EMBEDDED PIXEL DRIVER CHIPS

(71) Applicant: Apple Inc., Cupertino, CA (US)

(72) Inventor: Hsin-Hua Hu, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 262 days.

(21) Appl. No.: 15/247,249

(22) Filed: Aug. 25, 2016

Related U.S. Application Data

(60) Provisional application No. 62/232,281, filed on Sep. 24, 2015.

(51) Int. Cl.
| | |
|---|---|
| *H01L 25/16* | (2006.01) |
| *H01L 21/56* | (2006.01) |
| *H01L 23/00* | (2006.01) |
| *H01L 33/62* | (2010.01) |
| *H01L 25/18* | (2006.01) |
| *H01L 23/538* | (2006.01) |
| *H01L 25/00* | (2006.01) |
| *H01L 27/088* | (2006.01) |
| *H01L 27/15* | (2006.01) |

(52) U.S. Cl.
CPC .......... *H01L 25/18* (2013.01); *H01L 23/5389* (2013.01); *H01L 24/02* (2013.01); *H01L 24/24* (2013.01); *H01L 25/50* (2013.01); *H01L 27/088* (2013.01); *H01L 27/156* (2013.01); *H01L 2224/02381* (2013.01); *H01L 2224/24146* (2013.01); *H01L 2224/24147* (2013.01)

(58) Field of Classification Search
CPC ......... G09G 3/30–3291; G09G 3/3233; G09G 2300/0465; G09G 2300/0426; G09G 2300/0408; G02F 1/13452; G02F 1/136227; G02F 1/13454; G02F 1/133345; H01L 27/3248; H01L 27/322; H01L 27/3276
See application file for complete search history.

(56) References Cited

U.S. PATENT DOCUMENTS

| | | | |
|---|---|---|---|
| 7,999,454 B2 * | 8/2011 | Winters | H01L 27/3248 313/500 |
| 8,780,023 B2 | 7/2014 | Ootorii | |
| 2004/0032637 A1 | 2/2004 | Imamura | |
| 2005/0017268 A1 | 1/2005 | Tsukamoto et al. | |
| 2006/0192915 A1 * | 8/2006 | Kimura | G02F 1/1339 349/151 |
| 2010/0039030 A1 | 2/2010 | Winters et al. | |
| 2012/0206499 A1 * | 8/2012 | Cok | G09G 3/3208 345/690 |
| 2014/0110728 A1 | 4/2014 | Lee et al. | |
| 2014/0159064 A1 | 6/2014 | Sakariya et al. | |
| 2015/0169011 A1 * | 6/2015 | Bibl | G06F 3/0412 345/175 |

* cited by examiner

*Primary Examiner* — Deeprose Subedi
(74) *Attorney, Agent, or Firm* — Jaffery Watson Mendonsa & Hamilton LLP

(57) ABSTRACT

Embodiments describe a display integration scheme in which an array of pixel driver chips embedded front side up in an insulator layer. A front side redistribution layer (RDL) spans across and is in electrical connection with the front sides of the array of pixel driver chips, and an array of light emitting diodes (LEDs) is bonded to the front side RDL. The pixel driver chips may be located directly beneath the display area of the display panel.

19 Claims, 22 Drawing Sheets

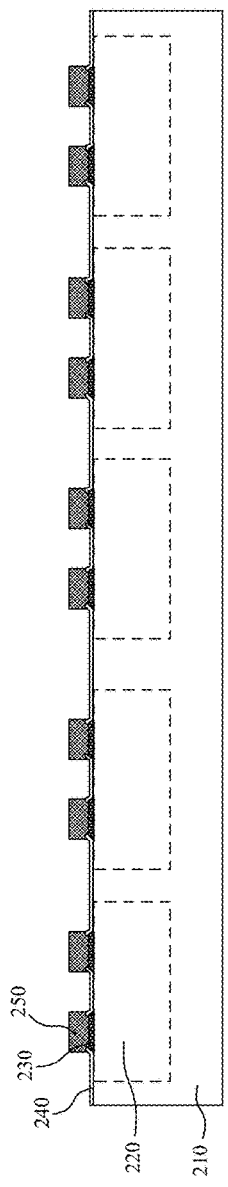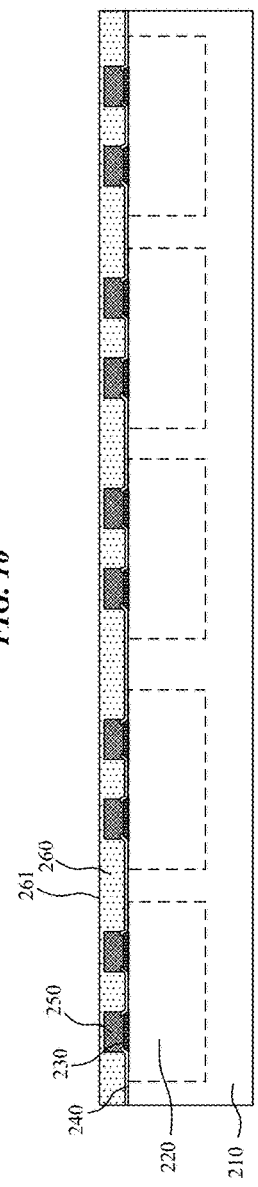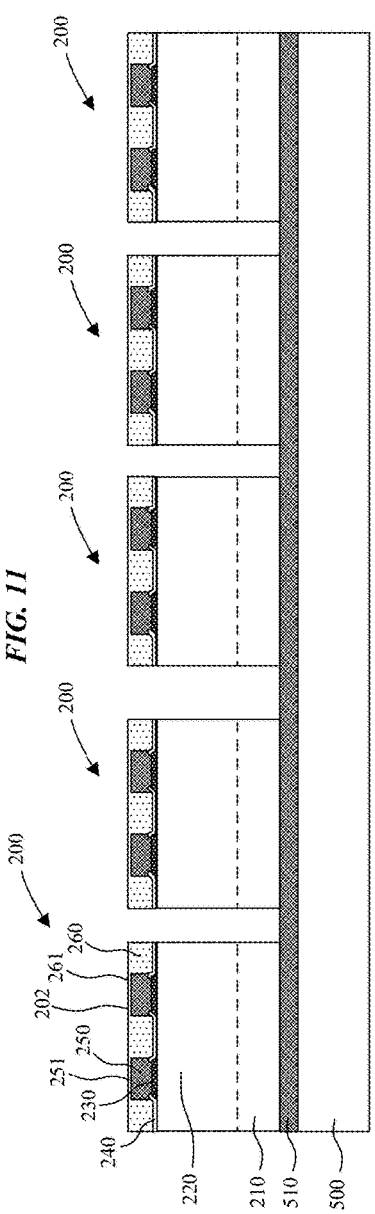

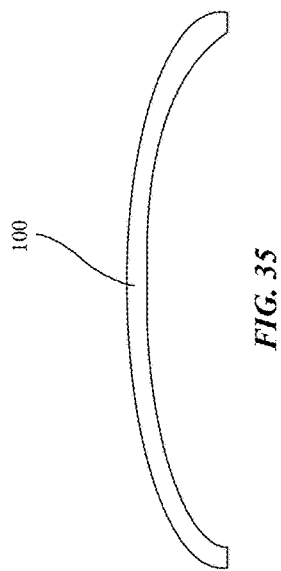
FIG. 35
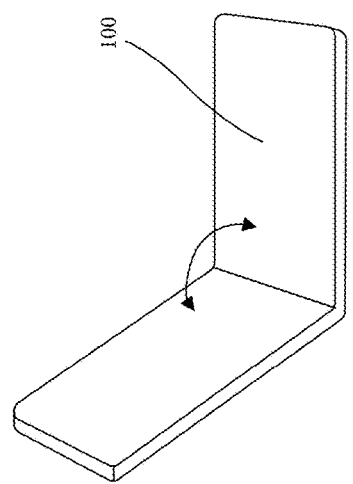
FIG. 36
FIG. 37

DISPLAY WITH EMBEDDED PIXEL DRIVER CHIPS

RELATED APPLICATIONS

This application claims the benefit of priority of U.S. Provisional Application No. 62/232,281 filed Sep. 24, 2015, which is incorporated herein by reference.

BACKGROUND

Field

Embodiments described herein relate to display panels. More particularly, embodiments relate to high resolution display panels.

Background Information

Flat panel display panels are gaining popularity in a wide range of electronic devices ranging from mobile electronics, to televisions and large outdoor signage displays. Demand is increasing for higher resolution displays, as well as for thinner, lighter weight, and lower cost electronic devices with larger screens.

Conventional organic light emitting diode (OLED) or liquid crystal display (LCD) technologies feature a thin film transistor (TFT) substrate. More recently, it has been proposed to replace the TFT substrate with a micro-matrix of micro light emitting diodes (LEDs) and microcontrollers bonded to the same side of a display substrate, in which each microcontroller is to switch and driver one or more micro LEDs.

SUMMARY

Embodiments describe a display integration scheme in which pixel driver chips are embedded face up in a display substrate. A front side redistribution layer (RDL) is formed over the pixel driver chips and insulator layer forming the display substrate, and the LEDs are placed on the front side RDL layer. This integration scheme may allow for significant freedom in designing and locating the pixel driver chips, which can be virtually any size. Conductive pillars can be formed through the insulating layer for connecting to chips that can be placed on a back side of the display substrate (e.g., power management IC, timing controller, processor, memory, etc.).

BRIEF DESCRIPTION OF THE DRAWINGS

FIG. 10 is a schematic cross-sectional side view illustration of conductive bumps on a device substrate in accordance with an embodiment.

FIG. 11 is a schematic cross-sectional side view illustration of a planarization layer formed over conductive bumps on a device substrate in accordance with an embodiment.

FIG. 12 is a schematic cross-sectional side view illustration of singulated pixel driver chips in accordance with an embodiment.

FIG. 35 is a side view illustration of a curved or flexible display panel in accordance with an embodiment.

FIG. 36 is an isometric view illustration of a foldable display panel in accordance with an embodiment.

FIG. 37 is a top view illustration of a plurality of display panel tiles, arranged side-by-side in accordance with an embodiment.

DETAILED DESCRIPTION

Figure 1:
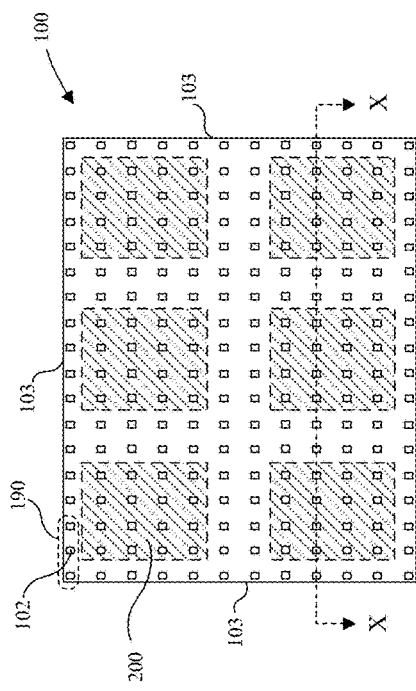
FIG. 1 is a schematic top view illustration of a display panel including an array of LEDs arranged over a plurality of embedded pixel driver chips in accordance with an embodiment.

Embodiments describe display panel configurations and methods of manufacture. In an embodiment, a display panel includes an array of pixel driver chips embedded front side up in an insulator layer, a front side redistribution layer (RDL) spanning across and in electrical connection with the front sides of the array of pixel driver chips, and an array of light emitting diodes (LEDs) bonded to the front side RDL. The array of LEDs may be arranged in an array of pixels, in which each pixel driver chip is to switch and drive a plurality of LEDs in the array of LEDs for a plurality of pixels.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning", and "on" as used herein may refer to a relative position of one layer with respect to other layers. One layer "above", "over", "spanning", or "on" another layer or bonded "to" or in "contact" with another layer may be directly in contact with the other layer or may have one or more intervening layers. One layer "between" layers may be directly in contact with the layers or may have one or more intervening layers.

In one aspect, embodiments describe display panel configurations that are compatible with high resolution displays. In accordance with embodiments, pixel driver chips for driving and switching the LEDs are embedded within the display substrate and electrically connected with the LEDs through a front side RDL. In such a configuration, size of the pixel driver chips is not limited by the pitch between LEDs. In this aspect, larger pixel driver chips with more functionality can potentially be integrated into the display panel. For an exemplary RGB display panel (pixels including a red-emitting, green-emitting, and blue-emitting LED) with 40 PPI (pixels per inch) may have an approximately 211 μm subpixel pitch, whereas an exemplary RGB display panel with 440 PPI may have an approximately 19 μm subpixel pitch. In accordance with embodiments, rather than locating the pixel driver chips between the LEDs on the display panel, the pixel driver chips are embedded within the display substrate allowing scalability of the display panel to high resolution display with high PPI. In accordance with embodiments, the pixel driver chips may be located directly beneath the LEDs and directly beneath the display area of the display panel.

In an embodiment, an LED may be an inorganic semiconductor-based material having a maximum lateral dimension of 1 to 300 μm, 1 to 100 μm, 1 to 20 μm, or more specifically 1 to 10 μm, such as 5 μm. In an embodiment a pixel driver may be in the form of a chip. In accordance with embodiments, the pixel driver chips can replace the switch (s) and storage device(s) for each display element as commonly employed in a TFT architecture. The pixel driver chips may include digital unit cells, analog unit cells, or hybrid digital and analog unit cells. Additionally, MOSFET processing techniques may be used for fabrication of the pixel driver chips on single crystalline silicon as opposed to TFT processing techniques on amorphous silicon (a-Si) or low temperature polysilicon (LTPS).

In one aspect, significant efficiencies may be realized over TFT integration techniques. For example, pixel driver chips may utilize less real estate of a display substrate than TFT technology. For example, pixel driver chips incorporating a digital unit cell can use a digital storage element (e.g., register) which consumes comparatively less area that an analog storage capacitor. Where the pixel driver chips include analog components, MOSFET processing techniques on single crystalline silicon can replace thin film techniques that form larger devices with lower efficiency on amorphous silicon (a-Si) or low temperature polysilicon (LTPS). Pixel driver chips may additionally require less power than TFTs formed using a-Si or LTPS. In addition, embodiments allow for the integration of known good pixel driver chips.

In another aspect, embodiments describe display panel configurations with an increased allocation for display area on the display panel. Conventional chip on glass (COG) packaging may require a driver ledge and/or contact ledge of at least 4-5 mm for allocation of driver IC chips and a flexible printed circuit (FPC) contact area. In accordance with embodiments, driver ledges and/or contact ledges may be removed from the front surface of the display panel. In an embodiment, row driver chips or column driver chips may be embedded within the display substrate along with the pixel driver chips, or bonded to a back side of the display panel. In an embodiment, conductive pillars provide electrical connection between the front side RDL and device chips (e.g., timing controller chip, power management IC, processor, touch sense IC, wireless controller, communications IC, etc.) bonded to a back side RDL.

In yet another aspect, embodiments describe display panel configurations of flexible display panels. For example, the display panels may be curved, rollable, foldable, or otherwise flexible. In other aspect, embodiments describe display panel configurations with increased display area. For example, multiple display panels may be arranged as tiles side-by side.

Figure 2:
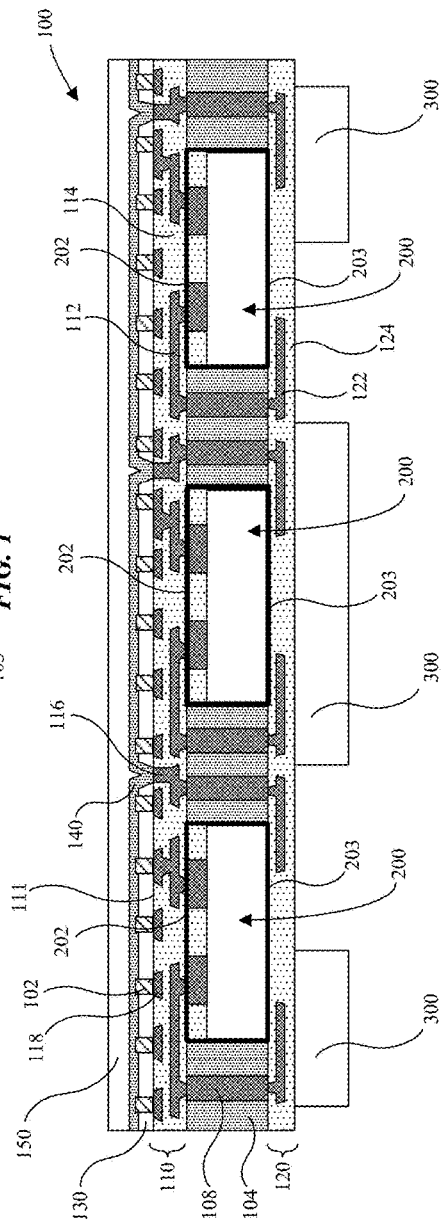
FIG. 2 is a schematic cross-sectional side view illustration of a display panel taken along line X-X of FIG. 1 in accordance with an embodiment.

Referring now to FIG. 1 a schematic top view illustration is provided of a display panel 100 including array of LEDs 102 arranged over a plurality of embedded pixel driver chips 200 in accordance with an embodiment. FIG. 2 is a schematic cross-sectional side view illustration of a display panel 100 taken along line X-X of FIG. 1 in accordance with an embodiment. Referring to both FIG. 1 and FIG. 2, a fine bevel edge widths, or distance between an outermost LED 102 and display panel edge 103, are possible in accordance with embodiments. In such a configuration, the proportion of display area for a display panel can be increased, particularly compared to conventional COG packaging technologies. However, it is to be appreciated that while such configurations may be possible, embodiments do not require such.

In an embodiment, an array of pixel driver chips 200 is embedded front side 202 up in an insulator layer 104. A front side redistribution layer (RDL) 110 spans across and is in electrical connection with the front sides 202 of the array of pixel driver chips 200. An array of LEDs 102 is bonded to the front side RDL 110, the array of LEDs 102 is arranged in an array of pixels 190. Each pixel 190 may include multiple subpixels that emit different colors of lights. In a red-green-blue (RGB) subpixel arrangement, each pixel may include three subpixels that emit red light, green light, and blue light, respectively. It is to be appreciated that the RGB arrangement is exemplary and that this disclosure is not so limited. Examples of other subpixel arrangements that can be utilized include, but are not limited to, red-green-blue-yellow (RGBY), red-green-blue-yellow-cyan (RGBYC), or red-green-blue-white (RGBW), or other subpixel matrix schemes where the pixels may have different number of subpixels.

In accordance with embodiments, each pixel driver chip 200 may switch and drive a plurality of LEDs 102 in the array of LEDs for a plurality of pixels 190. The display panels 100 in accordance with embodiments may include digital components, analog components, or a combination of both. For example, each pixel driver chip 200 may include an analog driving circuit, a digital driving circuit, or a driving circuit combining both analog and digital components. In an embodiment, the pixel driver chips each have a minimum x-y dimension that that is larger than a maximum pitch in the x-y dimensions between adjacent LEDs.

Referring to FIG. 2, each of the LEDs 102 may be bonded to a respective contact pad 118 on a front side 111 of the front side RDL 110. A sidewall passivation layer 130 may laterally surround the LEDs 102. Sidewall passivation layer 130 may be formed of an electrically insulating material, and may be transparent or opaque. One or more top conductive contact layers 140 may then be formed over one or more, or all of the LEDs 102. In an embodiment, top conductive contact layer 140 is transparent. For example, top conductive contact layer 140 may be formed of a transparent conductive oxide such as indium-tin oxide (ITO), or a transparent conductive polymer such as poly(3,4-ethylene-dioxythiophene) (PEDOT). In an embodiment, top conductive contact layer 140 is additionally formed on an in electrical contact with a Vss or ground line 116. A top encapsulation layer 150 may then be formed over the top conductive contact layer 140. Top encapsulation layer 150 may be formed of a transparent material.

In accordance with embodiments, a back side RDL 120 optionally spans across the insulator layer 104 and back sides 203 of the array of pixel driver chips 200. Additionally, a plurality of conductive pillars 108 may optionally extend through the insulator layer 104 from the back side RDL 120 to the front side RDL 110. While a back side RDL 120 and conductive pillars 108 are not required in accordance with embodiments, such a configuration can be used to increase the available display area on the front side of the substrate by providing routing to the back side of the display panel 100 as opposed to edges 103 of the display panel. In accordance with embodiments, one or more device chips 300 may be mounted on the back side RDL 120 and in electrical connection with the plurality of conductive pillars 108. For example, device chips 300 may include a power management IC, timing controller, touch sense IC, wireless controller, communications IC, processor, memory, etc.

In accordance with embodiments, the display panels 100 may include one or more row driver chips and/or column driver chips. In the embodiments illustrated in FIGS. 1-2, one or more row driver chips and/or column driver chips may be included among the device chips 300. In other embodiments, one or more row driver chips and column driver chips may be embedded front side up within the insulator layer 104, or mounted on (e.g., bonded to) the front side 111 of the front side RDL 110.

Figure 3:
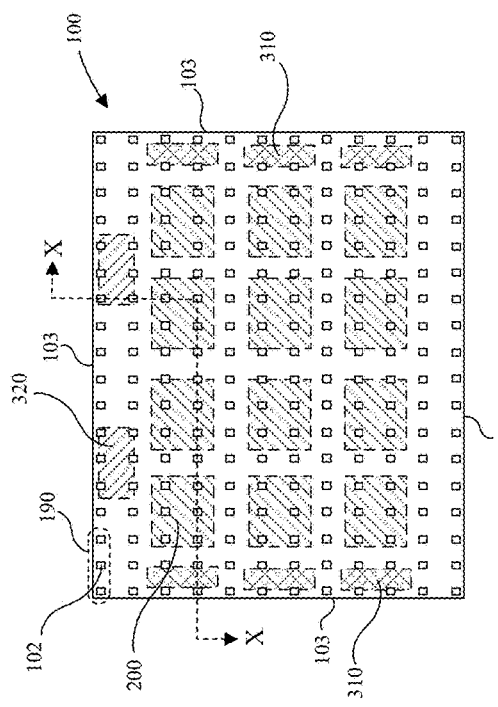
FIG. 3 is a schematic top view illustration of a display panel including an array of LEDs arranged over a plurality of embedded pixel driver chips, row driver chips, and column driver chips in accordance with an embodiment.
Figure 4:
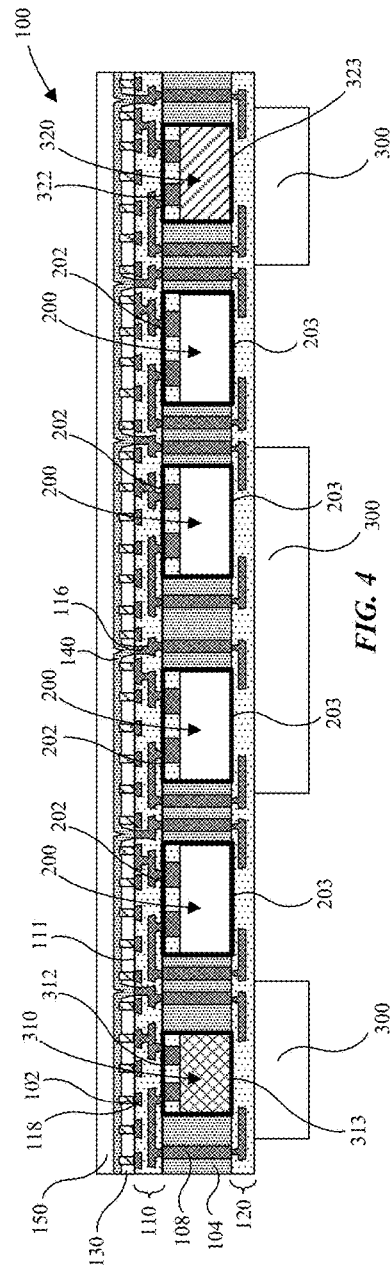
FIG. 4 is a schematic cross-sectional side view illustration of a display panel taken along line X-X of FIG. 3 in accordance with an embodiment.

Referring now to FIG. 3 a schematic top view illustration is provided of a display panel 100 including an array of LEDs 102 arranged over a plurality of embedded pixel driver chips 200, row driver chips 310, and column driver chips 320 in accordance with an embodiment. FIG. 4 is a schematic cross-sectional side view illustration of a display panel taken along line X-X of FIG. 3 in accordance with an embodiment. FIGS. 3-4 are similar to FIGS. 1-2 in that the display areas of the display panels 100 are not constrained by a requirement to surface mount chips on the same side of the display panel as the display area. Thus, display area can be increased by embedding row driver chips 310 and column driver chips 320 underneath the display area along with the pixel driver chips 200. In the embodiments illustrated in FIGS. 3-4, the row driver chips 310 are embedded front side 312 up in the insulator layer 104, and column driver chips 320 are embedded front side 322 up in the insulator layer 104. The front side RDL 110 spans across and is in electrical connection with the front sides 202 of the array of pixel driver chips 200, and front sides 312 of the plurality of row driver chips 310, and front sides 322 of the plurality of column driver chips 320. In an embodiment, a back side RDL 120 spans across the insulator layer 104 and the back sides 203 of the array of pixel driver chips 200, back sides 313 of the plurality of row driver chips 310, and back sides 323 of the plurality of column driver chips 320.

Figure 5:
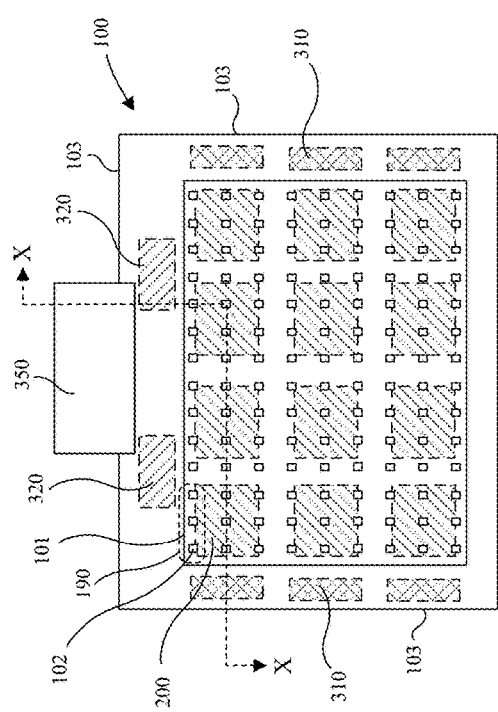
FIG. 5 is a schematic top view illustration of a display panel including an array of LEDs, row driver chips, and column driver chips arranged over a plurality of embedded pixel driver chips in accordance with an embodiment.
Figure 6:
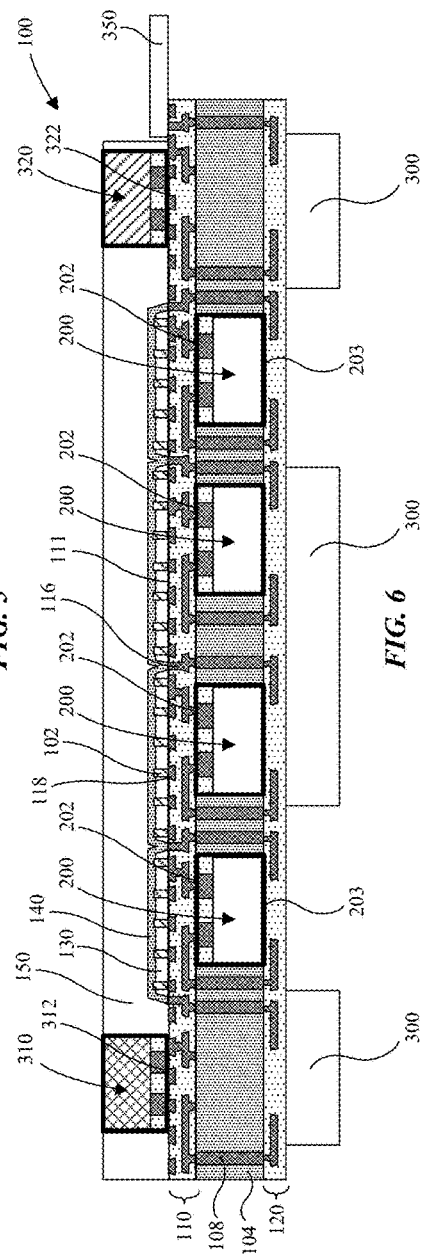
FIG. 6 is a schematic cross-sectional side view illustration of a display panel taken along line X-X of FIG. 5 in accordance with an embodiment.

Referring now to FIG. 5 a schematic top view illustration is provided of a display panel 100 including an array of LEDs 102, row driver chips 310, and column driver chips 320 arranged over a plurality of embedded pixel driver chips 200 and outside of the display area 101 of the display panel 100 in accordance with an embodiment. FIG. 6 is a schematic cross-sectional side view illustration of a display panel taken along line X-X of FIG. 5 in accordance with an embodiment. FIGS. 5-6 are differ from FIGS. 1-2 in that the display areas 101 of the display panels 100 are constrained by location of the row driver chips 310 and column driver chips 320. A flex circuit 350 is additionally illustrated in FIG. 5. For example, the flex circuit 350 can be attached to the front side RDL 110 or the back side RDL 120. In the embodiment illustrated the array of pixel driver chips 200 are embedded front side 202 up in the insulator layer 104 directly underneath the display area 101, and the plurality of row driver chips 310 are mounted front side 312 down on the front side RDL 110 outside of the display area 101. Pixel driver chips 200 may also be embedded front side 202 up in the insulator layer 104 outside of the display area 101, for example, directly underneath the row driver chips 310 and/or column driver chips 320.

FIGS. 1-6 illustrate a variety of configurations that are possible in accordance with embodiments. While several configurations have been illustrated separately, some may be combined in other embodiments. For example, a flex circuit 350 may be attached to the front side 111 of the front side RDL 110 in any of the embodiments illustrated in FIGS. 1-6 in order to provide an electrical connection to components off of the display panel 100, for example, when optional conductive pillars 108 and back side RDL 120 are not included. A flex circuit 350 may also be attached to the back side RDL 120.

Figure 7:
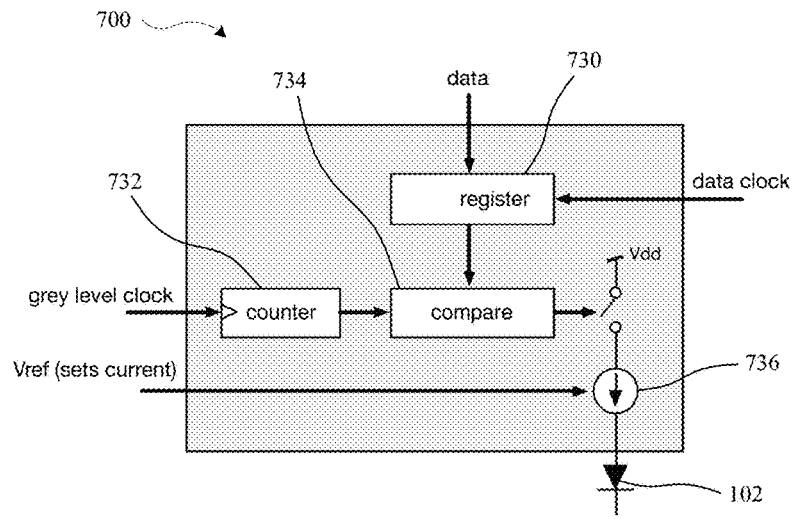
FIG. 7 is an illustration of a digital unit cell of a pixel driver chip in accordance with an embodiment.

FIG. 7 is an illustration of a digital unit cell 700 of a pixel driver chip 200 in accordance with an embodiment. The pixel driver chip 200 may include one or more unit cells 700, and may include one or more components of the unit cells 700. Depicted unit cell 700 includes a register 730 (e.g., digital data storage device) to store a data signal corresponding to the emission to-be-output from the LED 102. Data stored in a register may be referred to as a digital data, e.g., in contrast to analog data stored in a capacitor. Data (e.g., video) signal may be loaded (e.g., stored) into the register 730, for example, by being clocked in according to a data clock. In one embodiment, the data clock signal being active (e.g., goes high) allows data (e.g., from a column driver chip 320) to enter the register and then the data is latched into the register when the data clock signal (e.g., from a row driver chip 310) is inactive (e.g., goes low). A signal (e.g., non-linear) gray scale (e.g., level) clock (e.g., from a row driver chip 310) may increment a counter 732. Gray scale clock may also reset the counter to its original value (e.g., zero).

Unit cell 700 also includes a comparator 734. Comparator may compare a data signal from the register 730 to a number of pulses from a (e.g., non-linear) gray scale clock counted by counter 732 to cause an emission by LED 102 when the data signal differs from (e.g., or is greater or less than) the number of pulses from the non-linear gray scale clock. Depicted comparator may cause a switch to activate a current source 736 to cause the LED 102 to illuminate accordingly. A current source (e.g., adjusted via an input, such as, but not limited to a reference voltage (Vref) may provide current to operate an LED 102. A current source may have its current set by a control signal, such as a bias voltage setting the current, use of a (e.g., Vth) compensation pixel circuit, or adjusting a resistor of a constant current operational amplifier (opamp) to control the output of the opamp's current.

Figure 8:
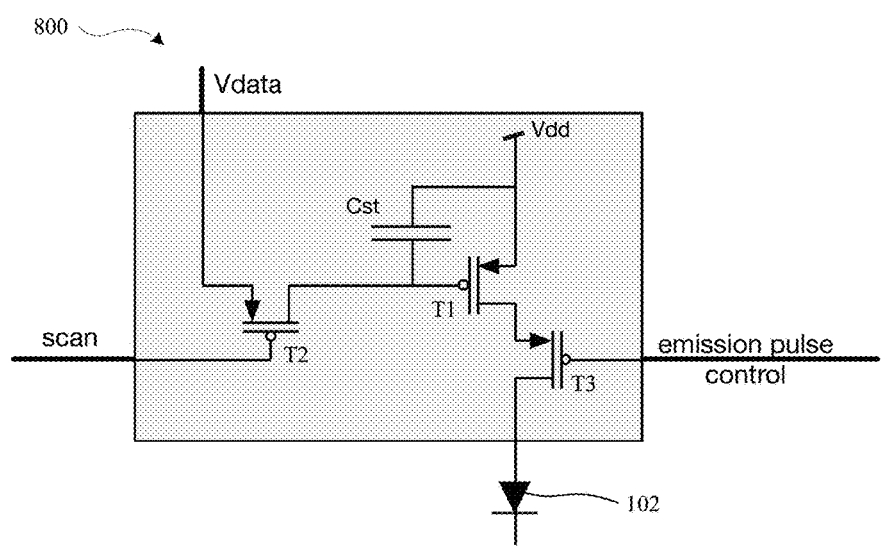
FIG. 8 is an illustration of an analog unit cell of a pixel driver chip in accordance with an embodiment.

FIG. 8 is an illustration of an analog unit cell 800 of a pixel driver chip 200 in accordance with an embodiment. The analog unit cell 800 is merely an example, and other pixel circuits may be utilized. As illustrated, analog unit cell 800 may include a storage capacitor (Cst) for holding the data voltage, a current driving transistor T1, a switching transistor T2 for sample and hold, and a switching transistor T3 for turning emission on and off. In an embodiment, Vdata (input) analog signals (e.g., from a column driver chip 320) is sampled by the switching transistor T2 and sets the gate voltage of the current driving transistor T1. In an embodiment, scan signals to the switching transistor T2 and emission pulse control signals to switching transistor T3 may be generated from one or more row driver chips 310.

Figure 9:
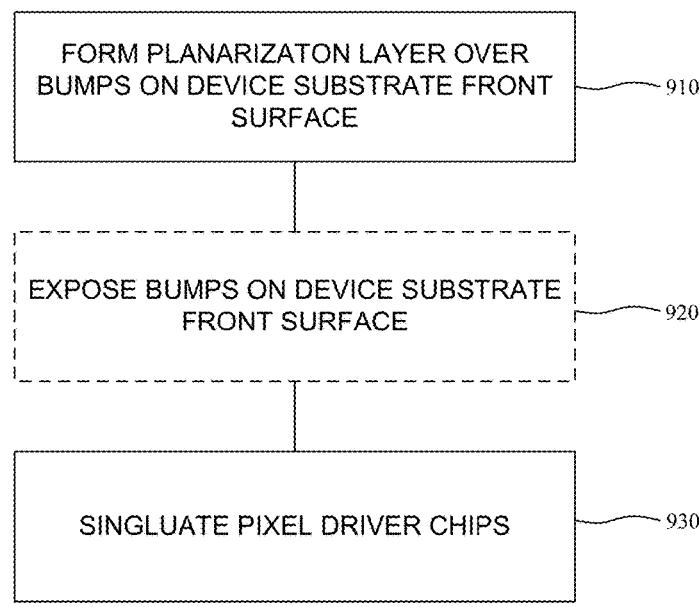
FIG. 9 is an illustration of a method of forming pixel driver chips in accordance with an embodiment.

FIG. 9 is an illustration of a method of forming pixel driver chips in accordance with an embodiment. In interest of clarity, the following description of FIG. 9 is made with regard to the schematic cross-sectional side view illustrations of FIGS. 10-12. As a starting point, a device substrate 210 may include active device regions 220. In an embodiment, device substrate 210 is a single crystalline silicon wafer, though other types of wafers may be used, such as silicon on insulator, or wafers formed from III-V semiconductor materials. In accordance with embodiments, the active device regions 220 contain the device components to be included in the pixel driver chips 200. It is to be appreciated, that while the following processes and processing sequences are described with regard to the manufacture of pixel driver chips 200, that the processes and processing sequences are equally applicable to the fabrication of other device chips such as row driver chips 310 and column driver chips 320. In an embodiment, pixel driver chips 200, row driver chips 310, and column driver chips 320 can all be fabricated form the same device substrate 210.

Referring to FIG. 10, a starting device substrate 210 may be a standard silicon wafer with an exemplary thickness between 200-1,000 µm, though other thicknesses may be used, particularly depending upon wafer size (e.g., diameter). Metal pads 230 may be formed on the device substrate 210. A passivation layer 240 may cover the device substrate 210 and include openings exposing the metal pads 230. In accordance with an embodiment, conductive bumps 250 (e.g., copper) are formed on the exposed metal pads 230. Conductive bumps 250 may include a single, or multiple layers.

As shown in FIG. 11, at operation 910 a planarization layer 260 is formed over the conductive bumps 250 on the front surface of the device substrate 210. Planarization layer 260 may be formed of an electrically insulating material. In an embodiment, planarization layer 260 is formed of a polymer fill material such as, but not limited to, polybenzoxazole (PBO). Planarization layer 260 may be formed using a suitable deposition technique such as slot coating or spin coating. In an embodiment, a front surface 261 of planarization layer 260 is planarized. For example, planarization may be achieved using chemical mechanical polishing (CMP) after depositing the planarization layer 260.

At operation 920, the conductive bumps 250 on the device substrate 210 front surface are optionally exposed. However, it is not necessary to expose the conductive bumps 250 at this processing stage for all embodiments. In the particular embodiment illustrated in FIG. 10, the top side 261 of the planarization layer 260 is over the top side 251 of the conductive bumps 250. At operation 930 the pixel driver chips 200 are singulated from the device substrate 210. As illustrated in FIG. 12, singulation may include first attaching the device substrate 210 to an adhesive (e.g., tape) layer 510 on a carrier substrate 500, followed by cutting to form individual pixel driver chips 200.

Figure 13:
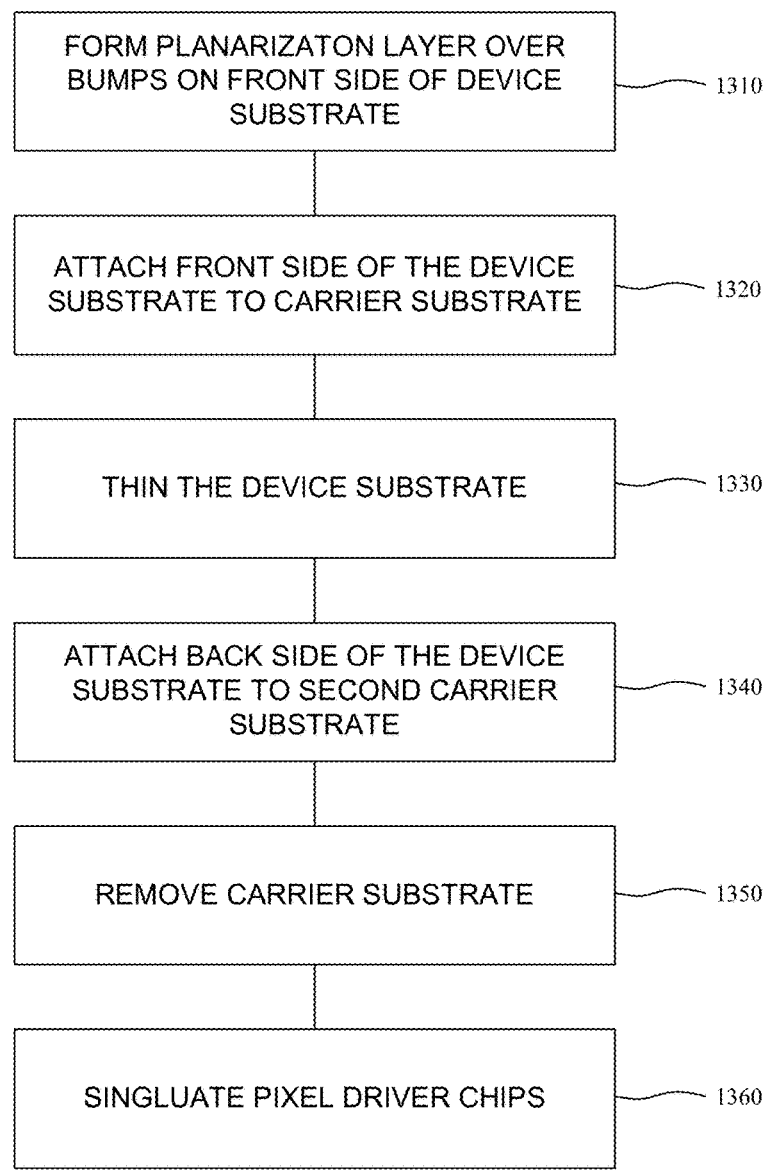
FIG. 13 is an illustration of a method of forming pixel driver chips in accordance with an embodiment.
Figure 14:
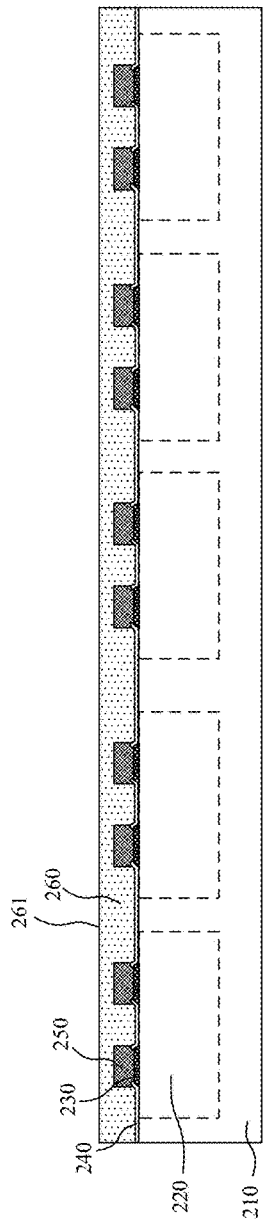
FIG. 14 is a schematic cross-sectional side view illustration of a planarization layer formed over conductive bumps on a device substrate in accordance with an embodiment.
Figure 15:
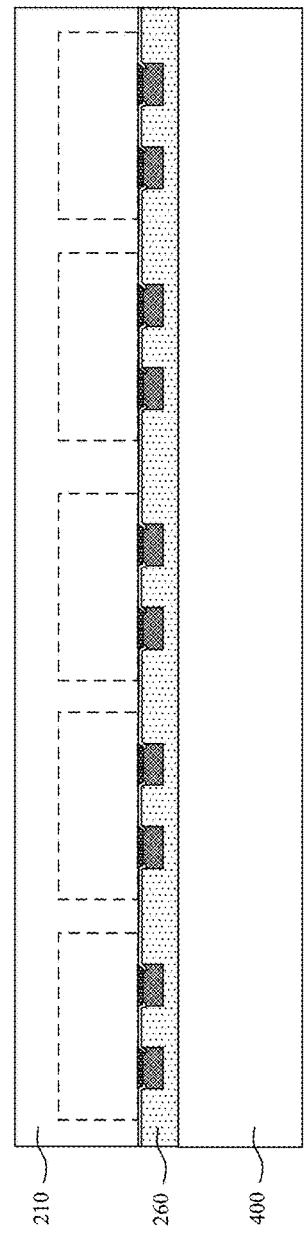
FIG. 15 is a schematic cross-sectional side view illustration of a device substrate attached to a carrier substrate in accordance with an embodiment.
Figure 16:
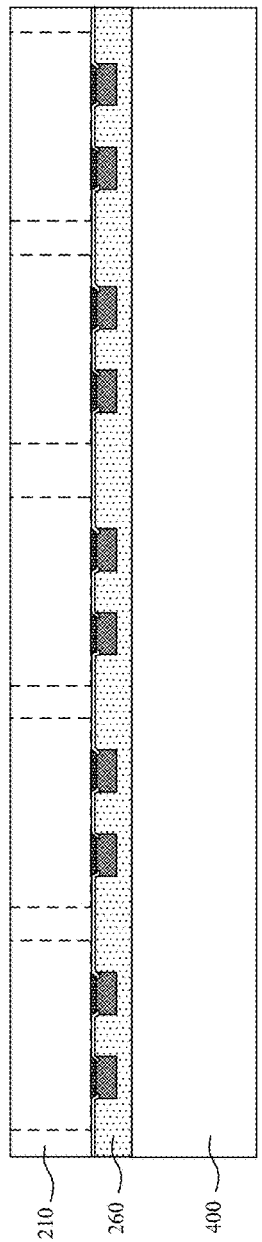
FIG. 16 is a schematic cross-sectional side view illustration of a thinned device substrate in accordance with an embodiment.

FIG. 13 is an illustration of a method of forming pixel driver chips in accordance with an embodiment. In interest of clarity, the following description of FIG. 13 is made with regard to the schematic cross-sectional side view illustrations of FIGS. 14-19. In interests of conciseness, description of features with substantial similarities to those previously described with regard to FIGS. 9-12 may not be repeated. Referring to FIG. 14, similar to operation 910, at operation 1310 a planarization layer 260 is formed over the conductive bumps 250 on the front surface of the device substrate 210. As shown in FIG. 15, at operation 1320 the front side of the device substrate 210 is attached to a carrier substrate 400. Referring now to FIG. 16, at operation 1330 the device substrate 210 is thinned, for example using a grinding technique (e.g., CMP), or a combination of etching and grinding. The resultant thickness of the thinned device substrate 210 may depend upon the resultant flexibility required of the display panel to be formed and depth of the active device regions 220. In an embodiment, the device substrate 210 is thinned to approximately 100 µm, though the thinned device substrate 210 may be thinner than 100 µm (e.g., 5 µm, 20 µm, etc.) or thicker than 100 µm.

Figure 17:
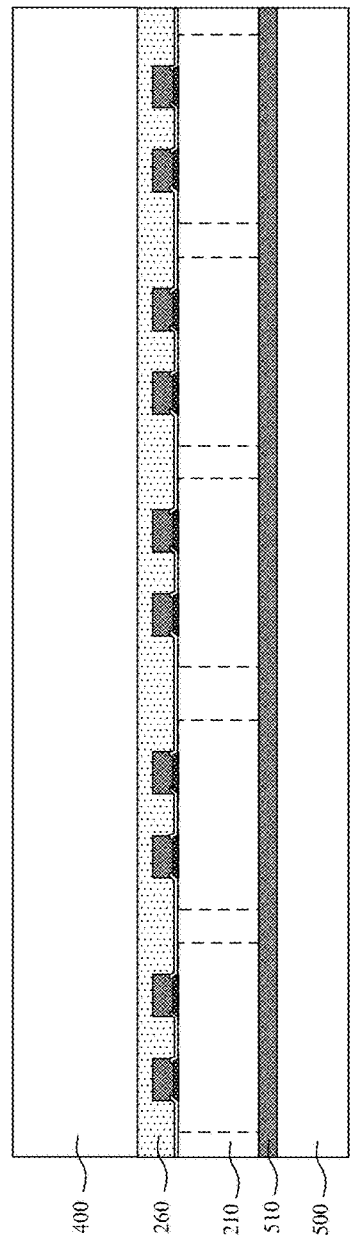
FIG. 17 is a schematic cross-sectional side view illustration of a thinned device substrate attached to a second carrier substrate in accordance with an embodiment.
Figure 18:
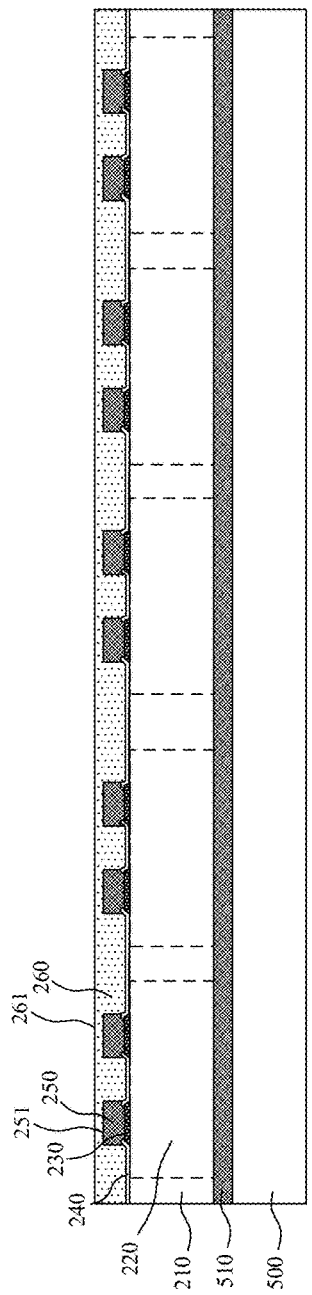
FIG. 18 is a schematic cross-sectional side view of a planarized planarization layer in accordance with an embodiment.
Figure 19:
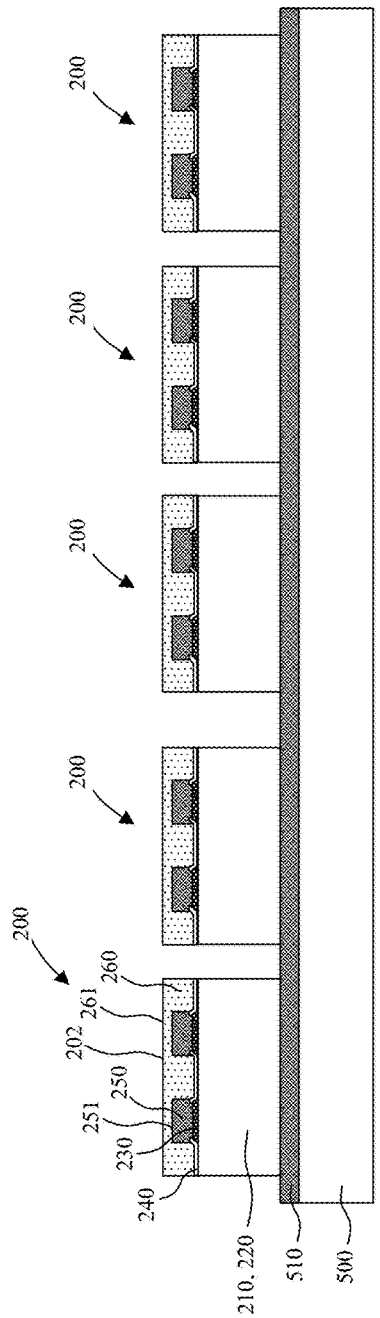
FIG. 19 is a schematic cross-sectional side view illustration of singulated pixel driver chips in accordance with an embodiment.

Referring now to FIG. 17, at operation 1340 the back side of the thinned device substrate 210 is attached to a second carrier substrate 500, for example, with an adhesive (e.g., tape) layer 510. The carrier substrate 400 is then removed at operation 1350, as illustrated in FIG. 18, and individual pixel driver chips 200 are singulated from the device substrate 210 at operation 1360, as illustrated in FIG. 19.

Figure 20:
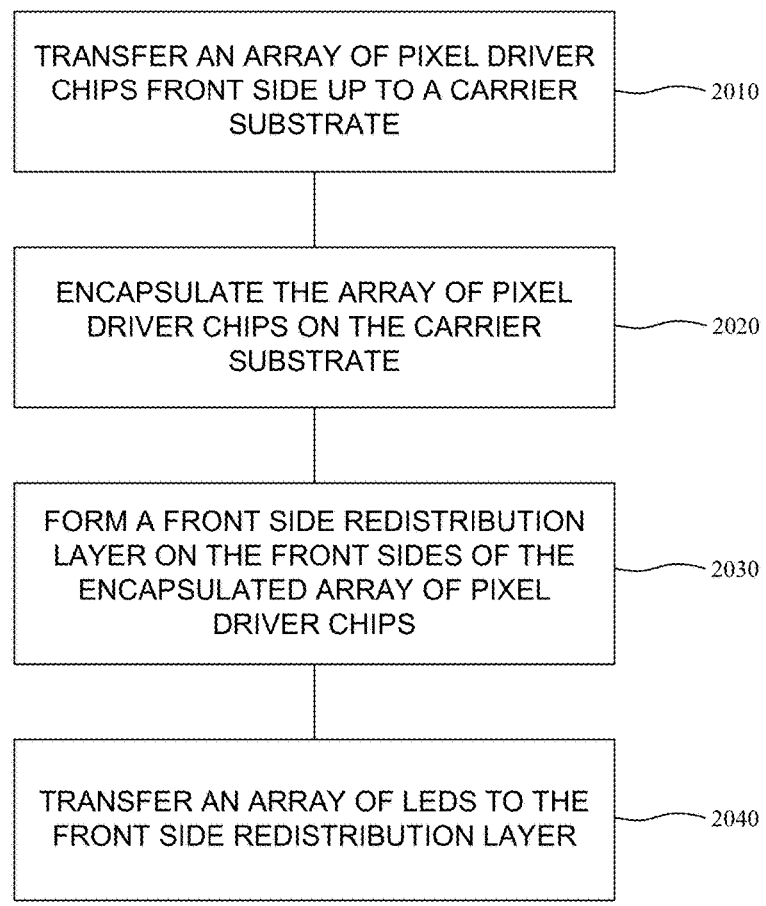
FIG. 20 is an illustration of a method of forming a display panel in accordance with an embodiment.
Figure 21:
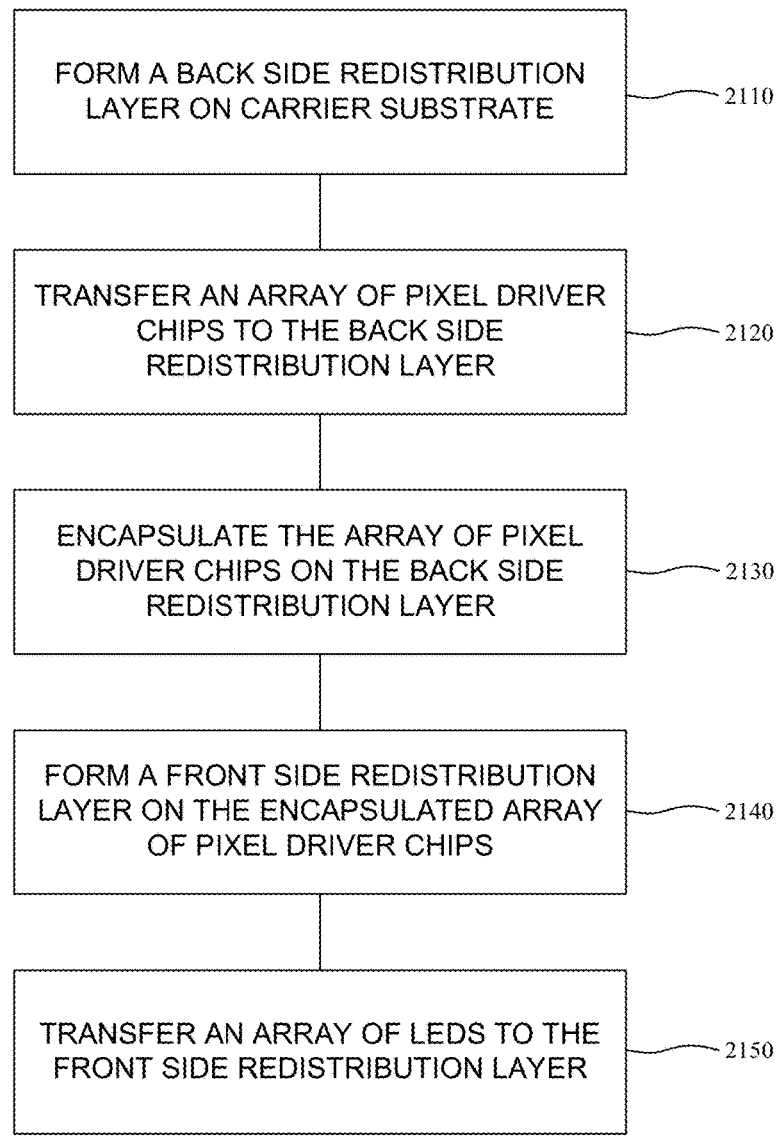
FIG. 21 is an illustration of a method of forming a display panel in accordance with an embodiment.

FIGS. 20-21 are illustrations of methods of forming display panels 100 in accordance with embodiments. In interest of clarity, the following description of FIGS. 20-21 is made with regard to reference features found in the schematic cross-sectional side view illustrations of FIGS. 22-27. Referring to FIG. 20, at operation 2010 an array of pixel driver chips 200 is transferred front side 202 up to a carrier substrate 600. At operation 2020 the array of pixel driver chips 200 is encapsulated on the carrier substrate 600. At operation 2030 a front side RDL 110 is formed on the front sides 202 of the encapsulated array of pixel driver chips 200. At operation 2040 an array of LEDs 102 is transferred to the front side RDL 110.

Referring to FIG. 21, at operation 2110 a back side RDL 120 is formed on a carrier substrate 600. At operation 2120 an array of pixel driver chips 200 is transferred to the back side RDL 120. At operation 2130 the array of pixel driver chips 200 is encapsulated on the back side RDL 120. At operation 2140 a front side RDL 110 is formed on the encapsulated array of pixel driver chips 200. At operation 2150 an array of LEDs 102 is transferred to the front side RDL 110.

Figure 22:
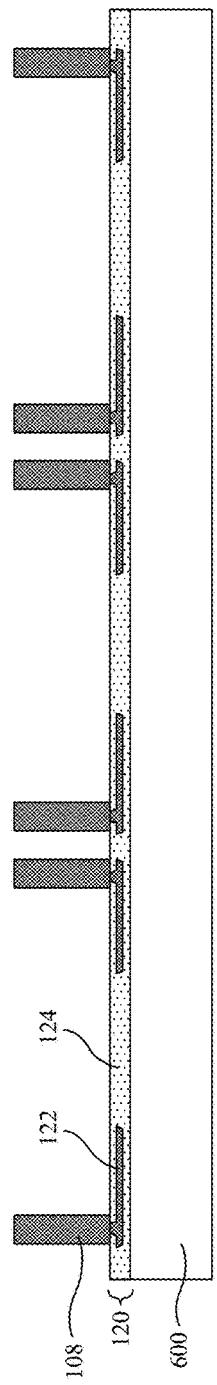
FIG. 22 is a schematic cross-sectional side view illustration of a plurality of conductive pillars formed on a back side RDL in accordance with an embodiment.

Referring now to FIG. 22, a back side RDL 120 is optionally formed on a carrier substrate 600, such as described with regard to operation 2110. Additionally, a plurality of conductive pillars 108 are optionally formed on the back side RDL 120. As described above, the formation of back side RDL 120 and conductive pillars 108 may allow for electrical connection to components on the back side of the display panel 100. However, back side connection is not necessarily required and is optional in accordance with embodiments. Accordingly, while the back side RDL 120 and conductive pillars 108 are illustrated and described, these features are not required.

Back side RDL 120 may have one or more redistribution lines 122 (e.g., copper) and dielectric layers 124. The back side RDL 120 may be formed by a layer-by-layer process, and may be formed using thin film technology. In an embodiment, the back side RDL 120 has a thickness of 5-50 µm. In an embodiment, the conductive pillars 108 are formed by a plating technique, such as electroplating using a patterned photoresist to define the conductive pillar 108 dimensions, followed by removal of the patterned photoresist layer. The material of conductive pillars 108 can include, but is not limited to, a metallic material such as copper, titanium, nickel, gold, and combinations or alloys thereof. In an embodiment, conductive pillars 108 are copper. In an embodiment, the conductive pillars 108 have a height (e.g., 100 µm) that is approximately the same as the thickness of the pixel driver chips 200.

Figure 23:
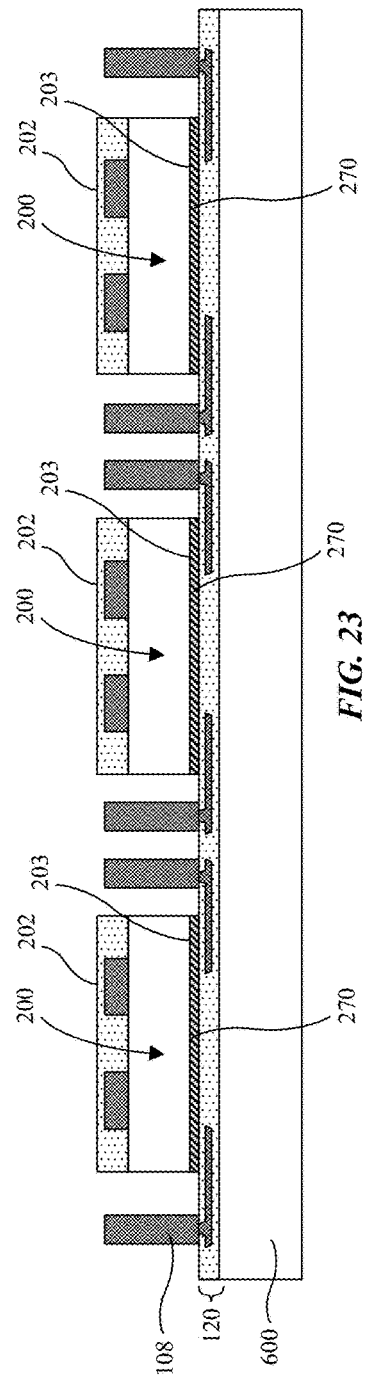
FIG. 23 is a schematic cross-sectional side view illustration of an array of pixel driver chips transferred face up to a carrier substrate in accordance with an embodiment.
Figure 24:
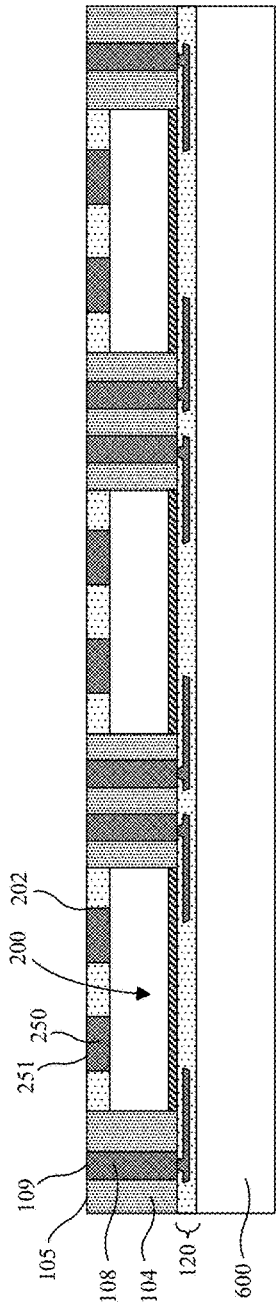
FIG. 24 is a schematic cross-sectional side view illustration of an array of pixel driver chips encapsulated on a carrier substrate in accordance with an embodiment.

Referring now to FIG. 23 an array of pixel driver chips 200 is transferred to the carrier substrate 600. In the embodiment illustrated, the pixel driver chips 200 are transferred front side 202 up on the carrier substrate 600. In an embodiment, the back sides 203 pixel driver chips 200 are attached to the carrier substrate 600 using a die attach film 270. In accordance with embodiments including a back side RDL 120, the pixel driver chips 200 are transferred front side 202 up on the back side RDL 120, and may be attached using die attach film 270.

The array of pixel driver chips 200 and optionally conductive pillars 108 are then encapsulated in an insulator layer 104. While not illustrated separately, row driver chips 310 and column driver chips 320 may also be encapsulated within the insulator layer 104 in certain configurations.

The insulator layer 104 may include a molding compound such as a thermosetting cross-linked resin (e.g., epoxy), though other materials may be used as known in electronic packaging. Encapsulation may be accomplished using a suitable technique such as, but not limited to, transfer molding, compression molding, and lamination. The insulator layer 104 may cover the front sides 109 of the conductive pillars 108 and front sides 202 of the pixel driver chips 200 following encapsulation. Following encapsulation, the front side 105 of the insulator layer 104 may be processed to expose the front sides 109 of the conductive pillars and front sides 251 of the conductive bumps 250. In an embodiment, the insulator layer is polished using CMP to form a planar front surface including front sides 105, 109, 251.

Figure 25:
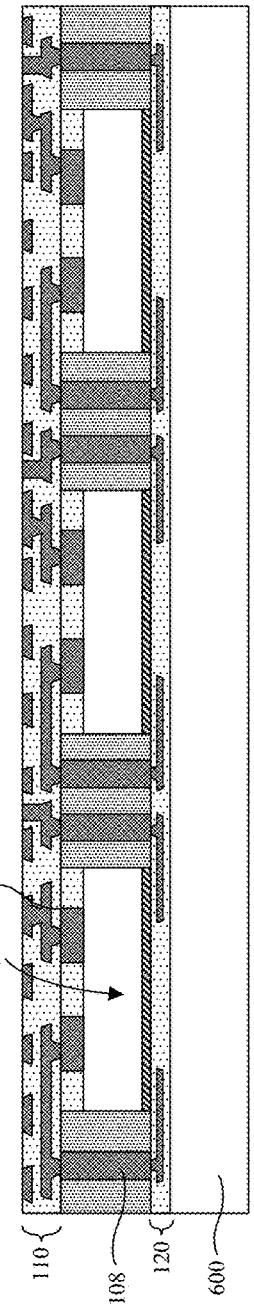
FIG. 25 is a schematic cross-sectional side view illustration of a front side RDL formed on an encapsulated array of pixel driver chips in accordance with an embodiment.

Referring now to FIG. 25, a front side RDL 110 is formed on the front sides 202 of the encapsulated array of pixel driver chips 200. When present, the front side RDL 110 may also be formed on the front sides of the encapsulated row driver chips 310 and column driver chips 320. Front side RDL 110 may have one or more redistribution lines 112 (e.g., copper) and dielectric layers 114. The front side RDL 110 may be formed by a layer-by-layer process, and may be formed using thin film technology. In an embodiment, the front side RDL 110 has a thickness of 5-50 µm. In an embodiment, the front side 111 of front side RDL 110 including contact pads 118 is planarized.

Figure 26:
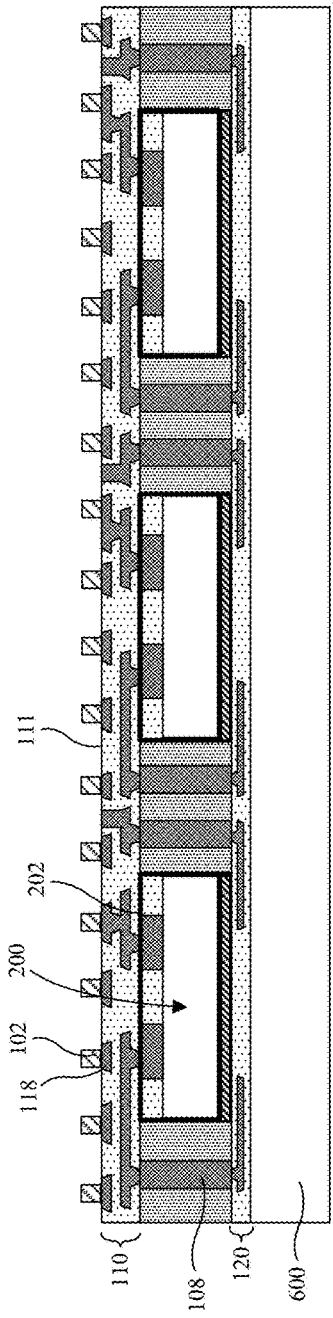
FIG. 26 is a schematic cross-sectional side view illustration of an array of LEDs transferred to a front side RDL in accordance with an embodiment.

LEDs 102 may be bonded to a respective contact pad 118 on a front side 111 of the front side RDL 110 as illustrated in FIG. 26. In an embodiment, prior to transferring the LEDs 102 solder posts (e.g., indium) may be formed on the contacts pads 118 to facilitate bonding the LEDs 102 to the contact pads 118.

Figure 27:
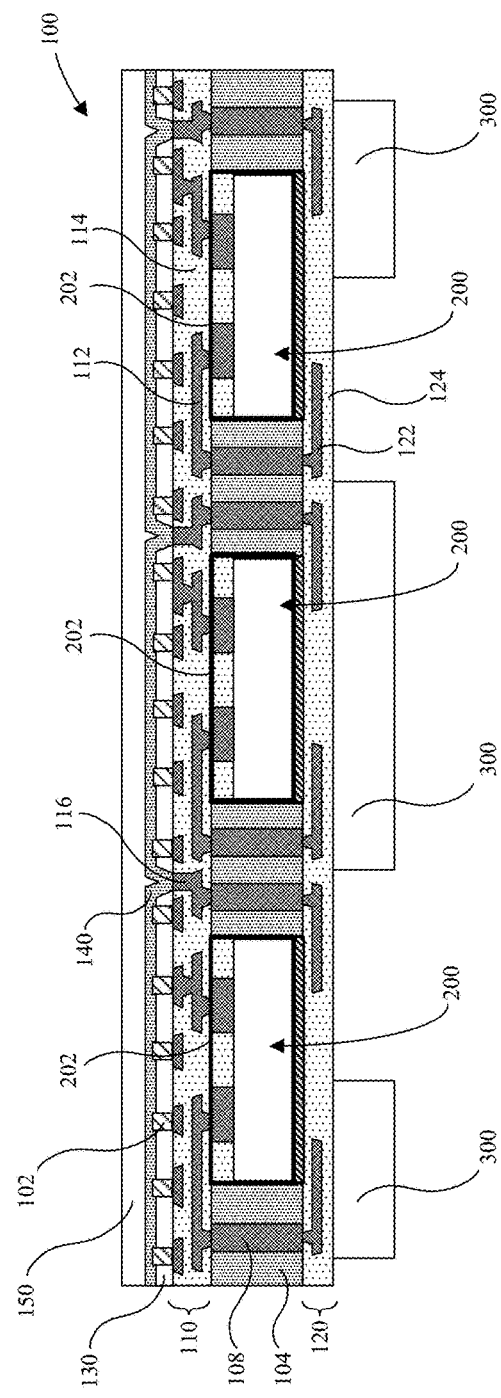
FIG. 27 is a schematic cross-sectional side view illustration of a display panel including embedded pixel driver chips in accordance with an embodiment.

Referring now to FIG. 27, a sidewall passivation layer 130 may then be formed laterally around the LEDs 102. Sidewall passivation layer 130 may be formed of an electrically insulating material such as, but not limited to, epoxy or acrylic, and may be transparent or opaque. One or more top conductive contact layers 140 may then be formed over one or more, or all of the LEDs 102. In an embodiment, top conductive contact layer 140 is transparent. For example, top conductive contact layer 140 may be formed of a transparent conductive oxide such as ITO, or a transparent conductive polymer such as PEDOT. In an embodiment, top conductive contact layer 140 is additionally formed on an in electrical contact with a Vss or ground line 116. A top encapsulation layer 150 may then be formed over the top conductive contact layer 140. Top encapsulation layer 150 may be formed of a transparent material. Carrier substrate 600 may be removed, and one or more device chips 300 may be attached to the back side of the display panel 100, for example, to the back side RDL 120.

Figure 28:
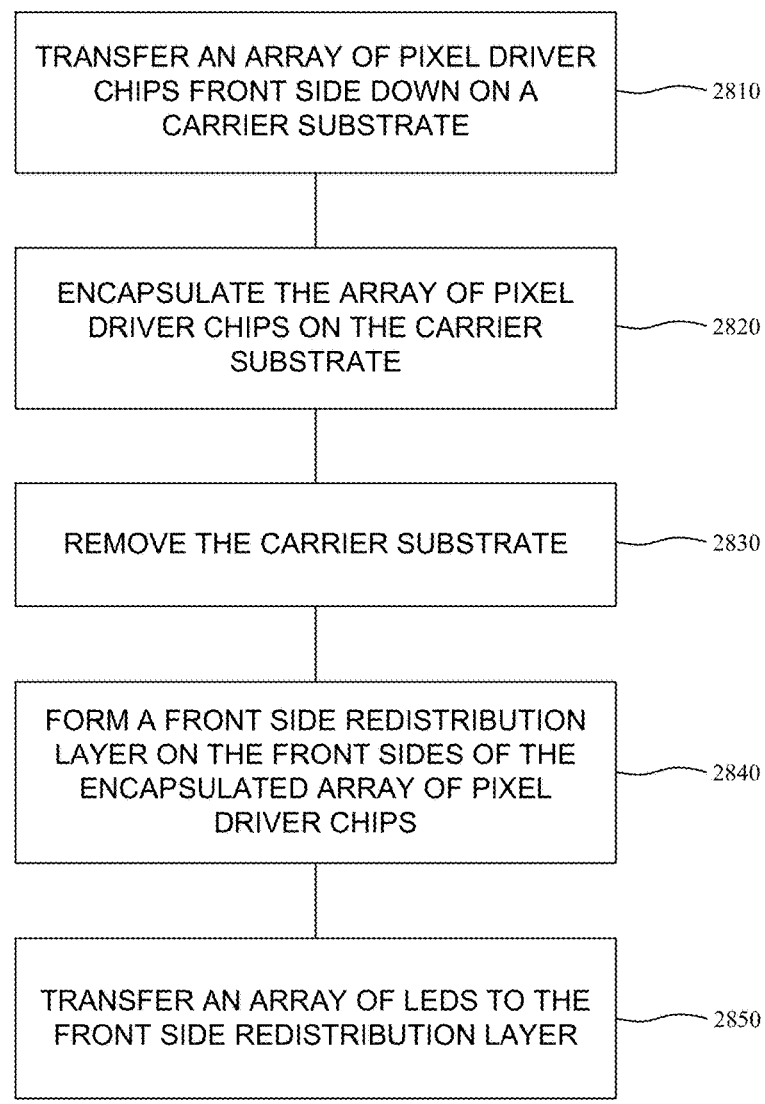
FIG. 28 is an illustration of a method of forming a display panel in accordance with an embodiment.
Figure 29:
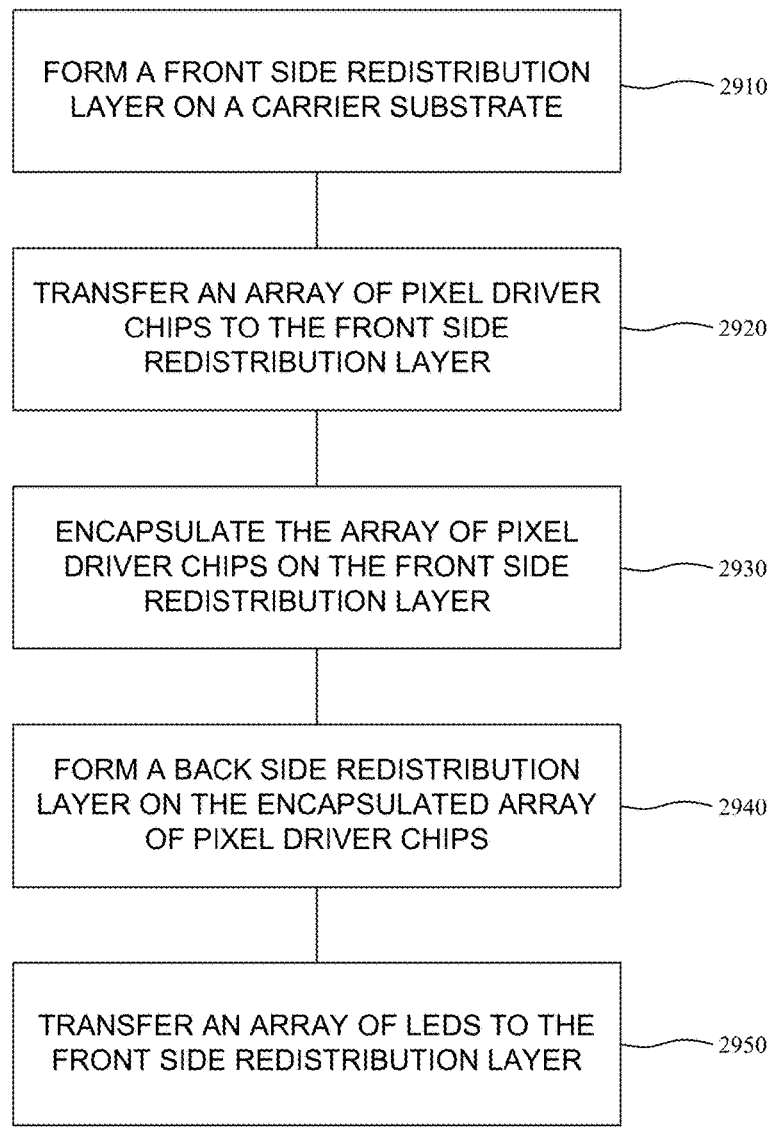
FIG. 29 is an illustration of a method of forming a display panel in accordance with an embodiment.

FIGS. 28-29 are illustrations of methods of forming display panels 100 in accordance with embodiments. In interest of clarity, the following description of FIGS. 28-29 is made with regard to reference features found in the schematic cross-sectional side view illustrations of FIGS. 30-34. Referring to FIG. 28, at operation 2810 an array of pixel driver chips 200 is transferred front side 202 down to a carrier substrate 610. At operation 2820 the array of pixel driver chips 200 is encapsulated on the carrier substrate 610. At operation 2830 the carrier substrate 610 is removed. At operation 2840 a front side RDL 110 is formed on the front sides 202 of the encapsulated array of pixel driver chips 200. At operation 2850 an array of LEDs 102 is transferred to the front side RDL 110.

Referring to FIG. 29, at operation 2910 a front side RDL 110 is formed on a carrier substrate 610. At operation 2920 an array of pixel driver chips 200 is transferred to the front side RDL 110. At operation 2930 the array of pixel driver chips 200 is encapsulated on the front side RDL 110. At operation 2940 a back side RDL 120 is formed on the encapsulated array of pixel driver chips 200. At operation 2950 an array of LEDs 102 is transferred to the front side RDL 110.

Figure 30:
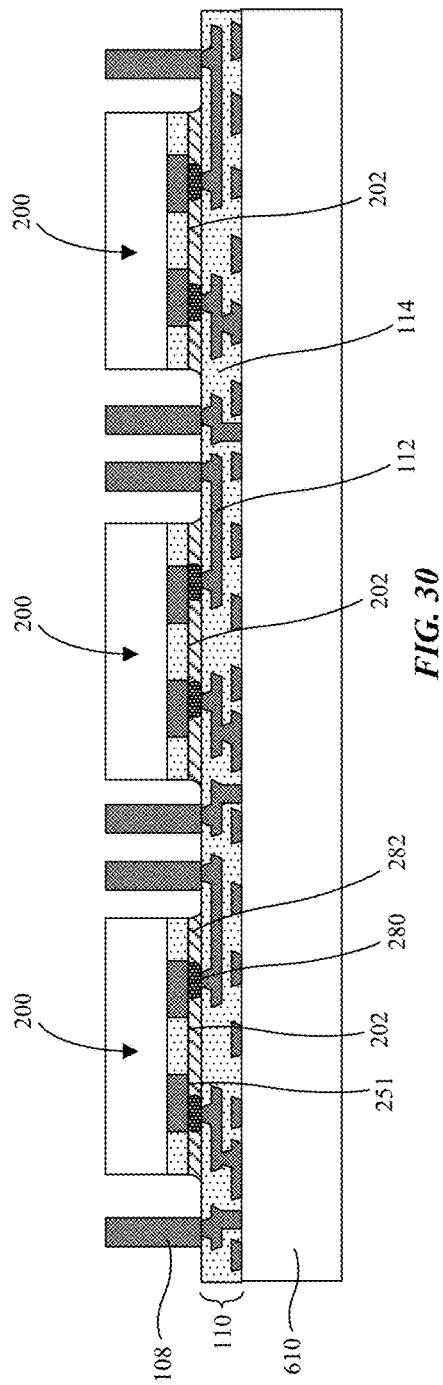
FIG. 30 is a schematic cross-sectional side view illustration of an array of pixel driver chips transferred face down to a carrier substrate in accordance with an embodiment.

Referring now to FIG. 30, a front side RDL 110 is formed on a carrier substrate 610, such as described with regard to operation 2910. Additionally, a plurality of conductive pillars 108 are optionally formed on the front side RDL 110. As described above, formation of the conductive pillars 108 may allow for electrical connection to components on the back side of the display panel 100. However, back side connection is not necessarily required and is optional in accordance with embodiments. Accordingly, while conductive pillars 108 are illustrated and described, these features are not required.

Front side RDL 110 may have one or more redistribution lines 112 (e.g., copper) and dielectric layers 114. The front side RDL 110 may be formed by a layer-by-layer process, and may be formed using thin film technology. In an embodiment, the front side RDL 110 has a thickness of 5-50 μm. In an embodiment, the conductive pillars 108 are formed by a plating technique, such as electroplating using a patterned photoresist to define the conductive pillar 108 dimensions, followed by removal of the patterned photoresist layer. The material of conductive pillars 108 can include, but is not limited to, a metallic material such as copper, titanium, nickel, gold, and combinations or alloys thereof. In an embodiment, conductive pillars 108 are copper. In an embodiment, the conductive pillars 108 have a height (e.g., 100 μm) that is approximately the same as the thickness of the pixel driver chips 200.

Still referring to FIG. 30 an array of pixel driver chips 200 is transferred to the carrier substrate 610. In the embodiment illustrated, the pixel driver chips 200 are transferred front side 202 down on the carrier substrate 610. In accordance with embodiments including a front side RDL 110, the pixel driver chips 200 are transferred front side 202 down on the front side RDL 110. In an embodiment, the pixel driver chips 200 may be bonded to the front side RDL 110 with conductive bumps, such as solder bumps 280. An underfill material 282 may optionally be applied around/under the pixel driver chips 200 to preserve the integrity of the electrical connections.

Figure 31:
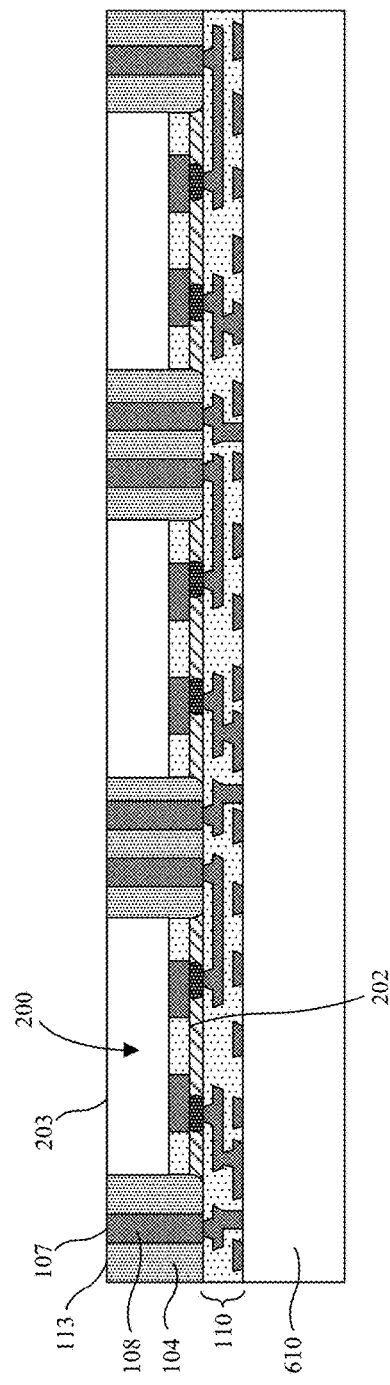
FIG. 31 is a schematic cross-sectional side view illustration of an array of pixel driver chips encapsulated on a carrier substrate in accordance with an embodiment.

As illustration in FIG. 31, the array of pixel driver chips 200 and optionally conductive pillars 108 are then encapsulated in an insulator layer 104. While not illustrated separately, row driver chips 310 and column driver chips 320 may also be encapsulated within the insulator layer 104 in certain configurations.

The insulator layer 104 may include a molding compound such as a thermosetting cross-linked resin (e.g., epoxy), though other materials may be used as known in electronic packaging. Encapsulation may be accomplished using a suitable technique such as, but not limited to, transfer molding, compression molding, and lamination. The insulator layer 104 may cover the back sides 107 of the conductive pillars 108 and back sides 203 of the pixel driver chips 200 following encapsulation. Following encapsulation, the back side 113 of the insulator layer 104 may be processed to expose the back sides 107 of the conductive pillars 108 and, optionally the back sides 203 of the pixel driver chips 200. In an embodiment, the insulator layer is polished using CMP to form a planar back surface including back sides 107, 113, 203.

Figure 32:
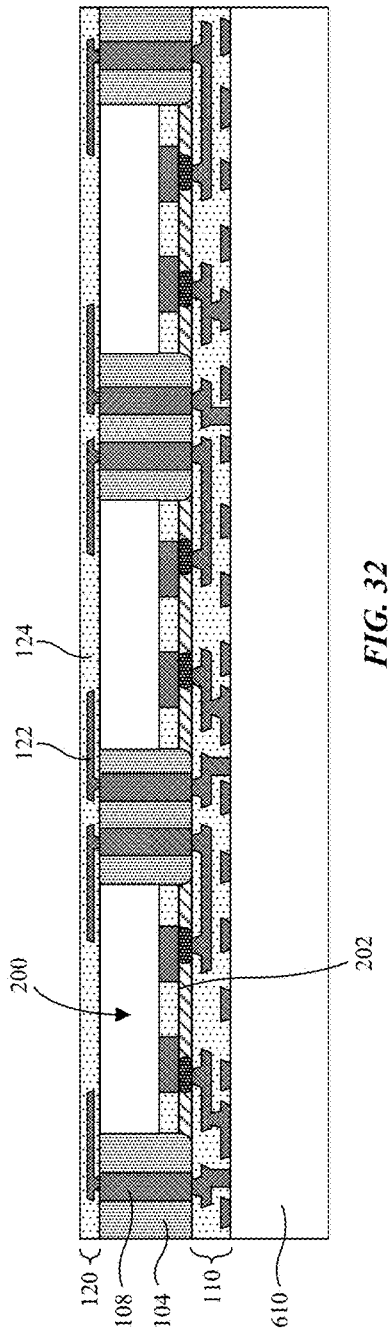
FIG. 32 is a schematic cross-sectional side view illustration of a back side RDL formed on an encapsulated array of pixel driver chips in accordance with an embodiment.

Referring now to FIG. 32, a back side RDL 120 is optionally formed on the back sides 203 of the encapsulated array of pixel driver chips 200. When present, the back side RDL 120 may also be formed on the back sides of the encapsulated row driver chips 310 and column driver chips 320. Back side RDL 120 may have one or more redistribution lines 122 (e.g., copper) and dielectric layers 124. The back side RDL 120 may be formed by a layer-by-layer process, and may be formed using thin film technology. In an embodiment, the back side RDL 120 has a thickness of 5-50 μm.

Figure 33:
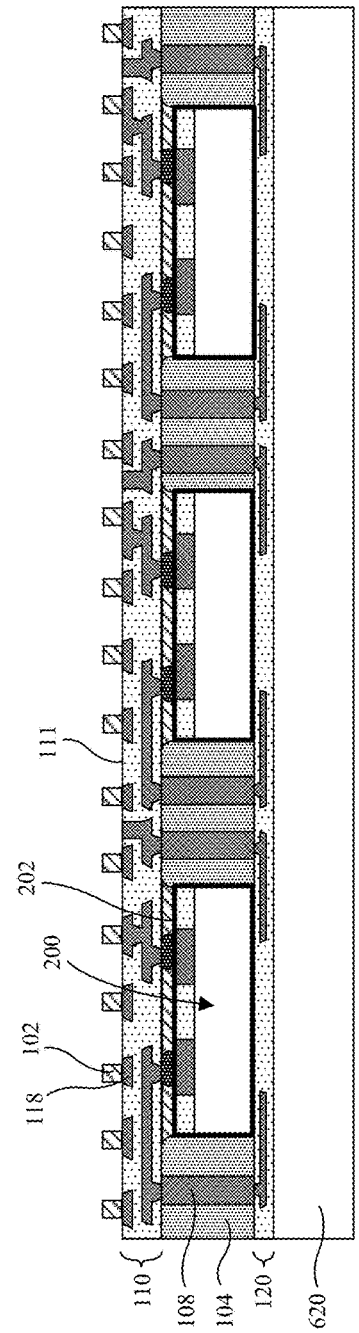
FIG. 33 is a schematic cross-sectional side view illustration of an array of LEDs transferred to a front side RDL in accordance with an embodiment.

Referring to FIG. 33, the carrier substrate 610 is removed from the front side RDL 110, and a second carrier substrate 620 may optionally be attached to the back side RDL 120, if present, to provide structural support. The front side RDL 110 may have a planar front side 111 after removal of the carrier substrate 610, though a planarization operation such as CMP may be performed to planarize the front side 111. LEDs 102 may be bonded to a respective contact pad 118 on a front side 111 of the front side RDL 110. In an embodiment, prior to transferring the LEDs 102 solder posts (e.g., indium) may be formed on the contacts pads 118 to facilitate bonding the LEDs 102 to the contact pads 118.

Figure 34:
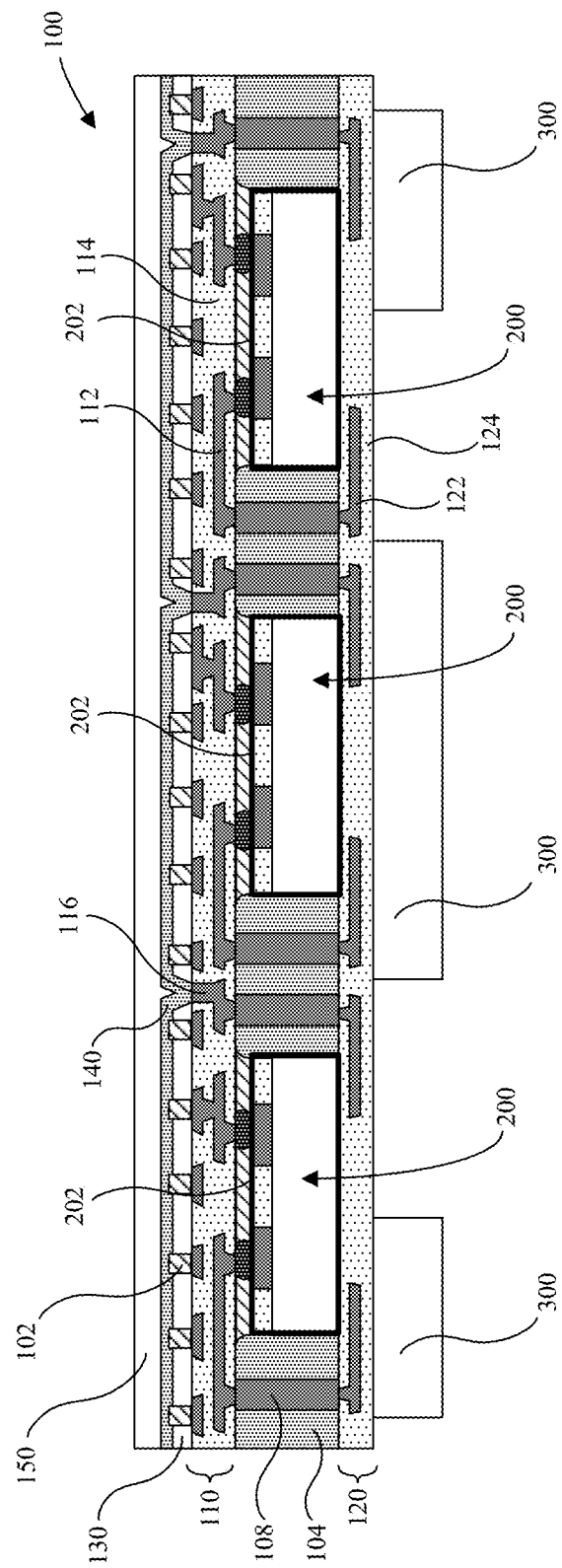
FIG. 34 is a schematic cross-sectional side view illustration of a display panel including embedded pixel driver chips in accordance with an embodiment.

Referring now to FIG. 34, a sidewall passivation layer 130 may then be formed laterally around the LEDs 102. Sidewall passivation layer 130 may be formed of an electrically insulating material such as, but not limited to, epoxy or acrylic, and may be transparent or opaque. One or more top conductive contact layers 140 may then be formed over one or more, or all of the LEDs 102. In an embodiment, top conductive contact layer 140 is transparent. For example, top conductive contact layer 140 may be formed of a transparent conductive oxide such as ITO, or a transparent conductive polymer such as PEDOT. In an embodiment, top conductive contact layer 140 is additionally formed on an in electrical contact with a Vss or ground line 116. A top encapsulation layer 150 may then be formed over the top conductive contact layer 140. Top encapsulation layer 150 may be formed of a transparent material. The second carrier substrate 620 may be removed, and one or more device chips 300 may be attached to the back side of the display panel 100, for example, to the back side RDL 120.

It is to be appreciated that the processing sequences described and illustrated in FIGS. 9-34 are exemplary, and embodiments are not necessarily so limited. For example, it is not required for the pixel driver chips 200 to be attached to an RDL with a die attach film or conductive bump. Processing sequence variations may be used to form a display panel in which the RDLs are formed directly on the front and back sides of the insulator layer or pixel driver chips 200. Accordingly, a number of variations are possible in accordance with embodiments.

The display panels in accordance with embodiments may be rigid, curved, rollable, foldable, or otherwise flexible. For example, FIG. 35 is a side view illustration of a curved or flexible display panel 100. FIG. 36 is an isometric view illustration of a foldable display panel 100 in accordance with an embodiment. FIG. 37 is a top view illustration of a plurality of display panel 100 tiles, arranged side-by-side. In such a configuration, the tiles may be used together to form a larger screen or display area. In one aspect, this may be facilitated by the increased display area on the front surface of the display panel 100 that is possible in accordance with embodiments.

Figure 38:
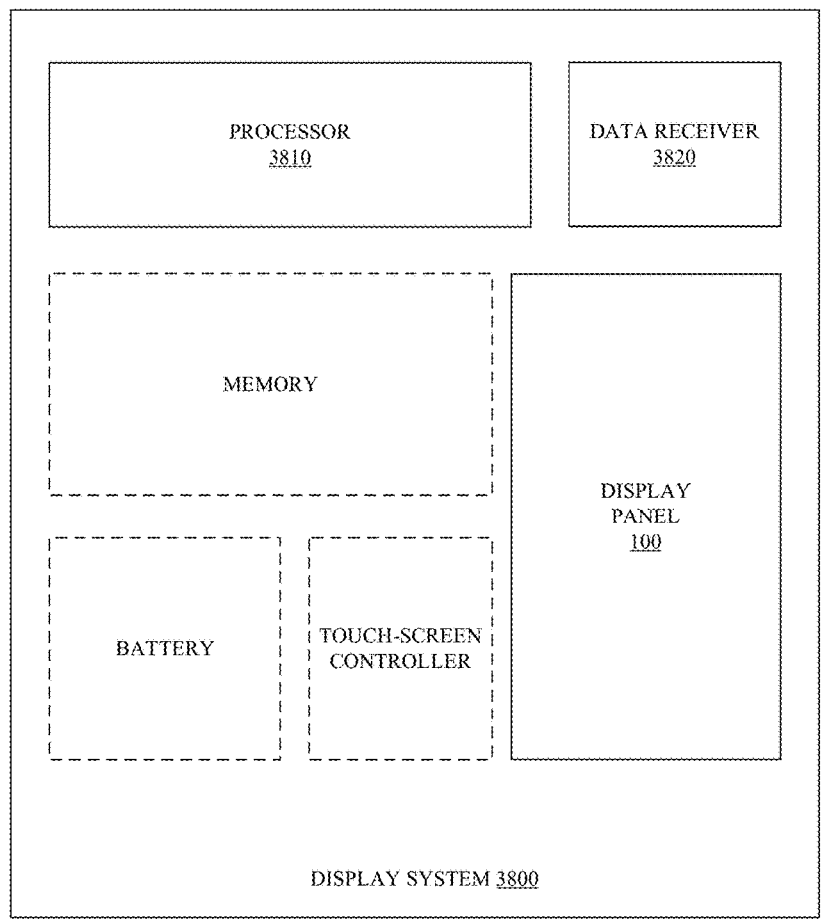
FIG. 38 is a schematic illustration of a display system in accordance with an embodiment.

FIG. 38 illustrates a display system 3800 in accordance with an embodiment. The display system houses a processor 3810, data receiver 3820, a one or more display panels 100 which may include one or more display driver ICs such as scan driver ICs and data driver ICs. The data receiver 3820 may be configured to receive data wirelessly or wired. Wireless may be implemented in any of a number of wireless standards or protocols.

Depending on its applications, the display system 3800 may include other components. These other components include, but are not limited to, memory, a touch-screen controller, and a battery. In various implementations, the display system 3800 may be a television, tablet, phone, laptop, computer monitor, kiosk, digital camera, handheld game console, media display, ebook display, or large area signage display.

In utilizing the various aspects of the embodiments, it would become apparent to one skilled in the art that combinations or variations of the above embodiments are possible for fabricating a display panel. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A display panel comprising:
   an array of pixel driver chips embedded front side up in an insulator layer;
   a front side redistribution layer (RDL) spanning across and in electrical connection with front sides of the array of pixel driver chips; and
   an array of light emitting diodes (LEDs) bonded to the front side RDL, the array of LEDs arranged in an array of pixels, wherein each pixel driver chip is to switch and drive a plurality of LEDs in the array of LEDs for a plurality of pixels;
   wherein each pixel driver chip has a minimum x-y dimension that that is larger than a maximum pitch in the x-y dimension between adjacent LEDs of the array of LEDs, and each pixel driver chip is characterized by pixel driver chip area in x-y dimensions that is directly underneath an entire LED area in the x-y dimensions for each of a corresponding plurality of LEDs of the array of LEDs.

2. The display panel of claim 1, further comprising a back side RDL spanning across the insulator layer and the array of pixel driver chips.

3. The display panel of claim 2, further comprising a plurality of conductive pillars extending through the insulator layer from the back side RDL to the front side RDL.

4. The display panel of claim 3, further comprising a plurality of device chips mounted on the back side RDL and in electrical connection with the plurality of conductive pillars.

5. The display panel of claim 1, wherein each pixel driver chip comprises an analog driving circuit.

6. The display panel of claim 5, wherein each pixel driver chip comprises a storage capacitor.

7. The display panel of claim 1, wherein each pixel driver chip comprises digital driving circuit.

8. The display panel of claim 7, each pixel driver chip comprises a data storage element.

9. The display panel of claim 1, further comprising a plurality of row driver chips.

10. The display panel of claim 9, wherein the plurality of row driver chips are embedded front side up in the insulator layer.

11. The display panel of claim 9, wherein the plurality of row driver chips are bonded to the front side RDL outside of a display area.

12. The display panel of claim 9, further comprising a back side RDL spanning across the insulator layer and the array of pixel driver chips, wherein the plurality of row driver chips are bonded to the back side RDL.

13. The display panel of claim 2, further comprising a device chip including a timing controller bonded to the back side RDL.

14. The display panel of claim 1, wherein each LED is formed of an inorganic semiconductor-based material.

15. The display panel of claim 1, wherein each LED has a maximum lateral dimension of 1 to 300 µm.

16. The display panel of claim 1, wherein each LED has a maximum lateral dimension of 1 to 20 µm.

17. The display panel of claim 1, further comprising a passivation layer laterally surrounding each LED of the array of LEDs.

18. The display panel of claim 17, further comprising a plurality of transparent top conductive contact layers formed over the passivation layer and the array of LEDs to make electrical contact with the array of LEDs.

19. The display panel of claim 1, wherein the front side RDL includes a plurality of dielectric layers and a plurality of redistribution lines.

* * * * *